(12) United States Patent
Ng et al.

(10) Patent No.: US 6,879,040 B2
(45) Date of Patent: Apr. 12, 2005

(54) SURFACE MOUNTABLE ELECTRONIC DEVICE

(75) Inventors: Kee Yean Ng, Penang (MY); Gurbir Singh, Penang (MY)

(73) Assignee: Agilent Technologies, Inc., Palo Alto, CA (US)

(*) Notice: Subject to any disclaimer, the term of this patent is extended or adjusted under 35 U.S.C. 154(b) by 0 days.

(21) Appl. No.: 10/649,005

(22) Filed: Aug. 26, 2003

(65) Prior Publication Data

US 2004/0051171 A1 Mar. 18, 2004

(30) Foreign Application Priority Data

Sep. 18, 2002 (MY) .......................................... PI20023479

(51) Int. Cl.[7] .......................... H01L 23/04; H01L 23/48; H01L 23/52

(52) U.S. Cl. ...................... 257/730; 257/666; 257/787; 257/692; 257/784; 257/773

(58) Field of Search ................................ 257/730, 773, 257/784, 666, 692, 787

(56) References Cited

U.S. PATENT DOCUMENTS 5,821,615 A * 10/1998 Lee .............................. 257/686
6,208,020 B1 * 3/2001 Minamio et al. ........... 257/684

* cited by examiner

Primary Examiner—Nitin Parekh

(57) ABSTRACT

A surface mountable electronic device includes a body with a first surface for mounting the device. The first surface has recessed portions therein. Electrical contacts are provided in the first surface. The electrical contacts include first portions that form at least a portion of at least one inner surface of said recessed portions.

14 Claims, 9 Drawing Sheets

Figure 2A (Prior Art)
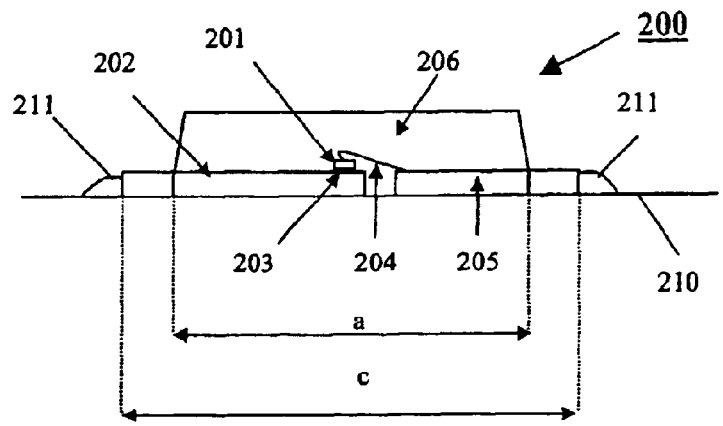
Figure 2B (Prior Art)
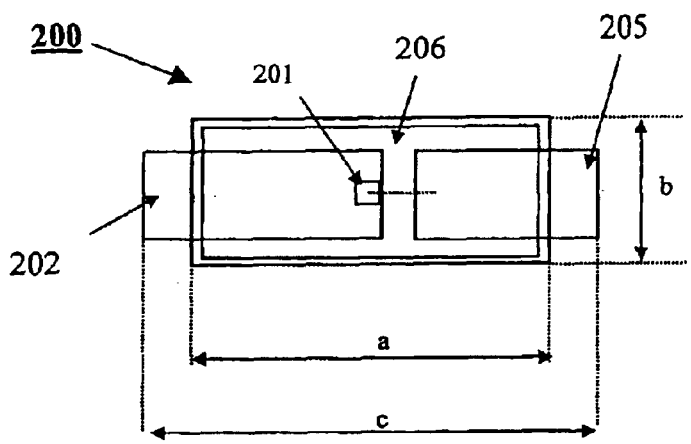
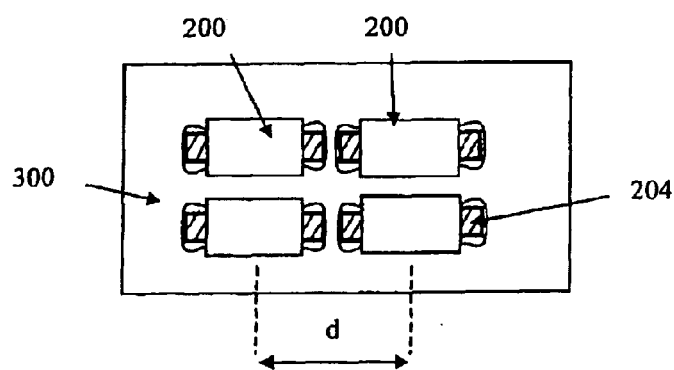
Figure 3
(Prior Art)

SURFACE MOUNTABLE ELECTRONIC DEVICE

The invention relates to surface mount technology (SMT). More particularly it relates to a surface mountable electronic device with electrical connections in recesses to allow solder therein to connect the device to a surface.

BACKGROUND OF THE INVENTION

Surface mount technology (SMT), where devices are mounted directly onto a surface without being plugged into it, is widely used in electronic applications. Miniaturization has influenced the usage of SMT, for instance for opto-electronic devices such as light emitting diode (LED) devices. LEDs based on surface mount technology are very small in size and are assembled onto a printed circuit board (PCB) using SMT machines. With the advent of brighter semiconductor materials in LEDs, the usage of surface mount opto-electronic devices has increased (in indoor and outdoor applications) in the area of backlighting, electronic signs/symbols such as variable message signs, or large full color video screens etc.

In bright ambient light conditions, LEDs must be bright enough for better visibility to an observer. The brightness of an LED is dependent on factors such as the type of semiconductor material, the drive current etc. Materials such as Indium Gallium Nitride (InGaN) and Aluminum Indium Gallium Phosphide (AlInGaP) have higher light efficiencies and therefore are used in LED manufacture. For higher drive currents, the LEDs must be assembled in packages that have very low thermal resistance, in order to withstand the heat produced. This, in turn, depends on the overall package design of the LEDs.

Package size is affected by package design. Package size determines the resolution of a display device. Given a fixed assembly area, the larger the package size, the fewer the devices that can be mounted and the lower the display resolution.

During assembly of an opto-electronic device, difficulties will be encountered if the leads of the SMT components do not facilitate proper soldering to the substrate. Presently, SMT devices are designed to have leads with vertical side walls or they extend out from the device so that a proper solder fillet can be formed during solder reflow.

A first example of a known type of surface mount opto-electronic device is shown in FIGS. 1A–1B. FIG. 1A is a top plan view and FIG. 1B is a side elevation.

In a first device 100, an LED 101 is electrically mounted on a contact 102 by way of an electrically conductive medium 103. A bond wire 104 electrically connects the LED 101 to another contact 105. Both contacts 102, 105 extend horizontally through the body 106 of the device 100 (in the orientation shown in FIG. 1A). Most of the body 106 is optically opaque, except for an inverted frusto-conical cavity 107, in which the LED 101, bond wire 104 and inner ends of the two contacts 102, 105 are encased in an optically clear plastic, with the edges of the cavity 107 acting as a reflector for light emitted from the LED 101. The two contacts 102, 105 extend horizontally outwards to the ends of the body 105, wrapping downwards around the lower halves of the sides 108 and back around under the bottom edges 109. During a solder reflow process to secure the device 100 to a substrate 110, the portions of the contacts 102, 105 running down the sides 108 are connected by solder joints 111 to the substrate 110, with the solder joints 111 against the outer vertical sides 108 of the LED device 100.

A second example of a known type of surface mount opto-electronic device is shown in FIGS. 2A–2B. FIG. 2A is a top plan view and FIG. 1B is a side elevation.

In a second device 200, an LED 201 is electrically mounted on a contact 202 by way of an electrically conductive medium 203. A bond wire 204 electrically connects the LED 201 to another contact 205. The whole body 206 of the device 200 is optically clear plastic. The two contacts 202, 205 extend horizontally outwards along the underside of the body 206, ending with horizontal portions outside the body 206. During the solder reflow process the contacts 202, 205 are connected to a substrate 210 by solder joints 211, with the solder joints 211 against the outer vertical surfaces of ends of the contacts 202, 205.

In both the above cases, the soldered points and the electrically conductive members extend outside the edges of the plastic body.

The LED device shown in FIGS. 1A–1B has many disadvantages. For instance, the thermal resistance of the device is very high because the heat path between the LED and the substrate is very long, which in turn, increases the temperature of the LED. Increase in temperature adversely affects the drive current of the LED. The footprint of the device is not much larger than the size of the plastic body "a" by "b" but the solder required to mount it extends well outside that footprint.

The design in FIGS. 2A–2B, with extended electrically conductive members, has an even longer footprint than that of FIGS. 1A–1B. This prevents close assembly of LED devices onto a substrate. The device footprint is length "c", which is significantly longer than the body 'a' of the device. With the solder, the overall required length is even greater.

The required sizes for the prior art devices affects the pixel resolution of an array of LED devices. An array of the devices of FIGS. 2A–2B is shown in FIG. 3, where they are mounted onto a PCB 300. The pitch "d" of the LED devices cannot be reduced. Otherwise short circuits may occur during assembly or use.

Additionally, in the devices of FIGS. 1A–1B and FIGS. 2A–2B, the extended electrically conductive members and solder joints are visibly exposed to an observer and because of their high reflectivity, cause an undesirable disturbance to the eyes. In other words, they reduce the contrast between the LEDs and the substrate. This phenomenon is even more severe in bright ambient light such as sunlight.

SUMMARY OF THE INVENTION

There is a need for surface mountable electronic devices which have reduced footprints, while maintaining low thermal resistance. With LED devices, there is also the need to have better contrast. It is an aim of the present invention to alleviate one or more of the disadvantages with the prior art at least partially.

According to one aspect of the invention, there is provided a surface mountable electronic device that includes: a body with a first, mounting surface for mounting the device. The first surface is recessed with recessed portions in it. There are also at least two electrical contacts in the first surface. The electrical contacts include first portions which form at least a portion of at least one inner surface of the recessed portions. Thus, there are gaps beneath them when the device is mounted.

BRIEF DESCRIPTION OF THE DRAWINGS

The present invention will be further described by way of non-limitative examples with reference to the accompanying drawings, in which:

FIGS. 2A–2B are side and top views of another known type of surface mountable opto-electronic device;

FIG. 3 is a plan view of an array of the devices of FIGS. 2A–2B, soldered onto a substrate;

DETAILED DESCRIPTION

Figure 1A:
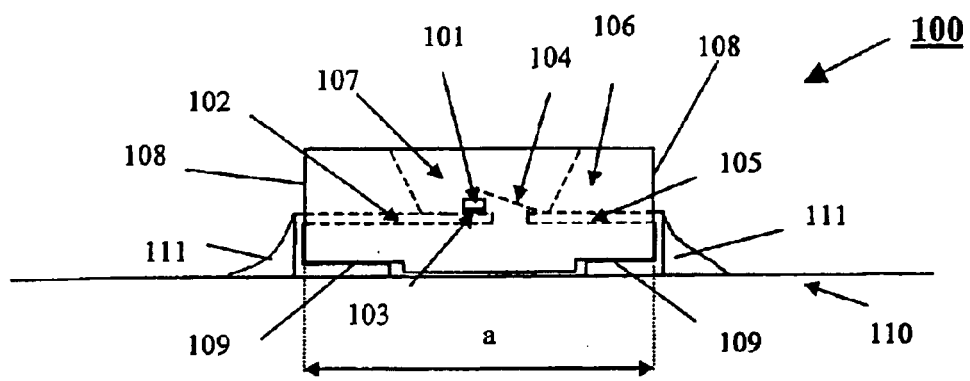
FIGS. 1A–1B are side and top views of a known type of surface mountable opto-electronic device.
Figure 1B:
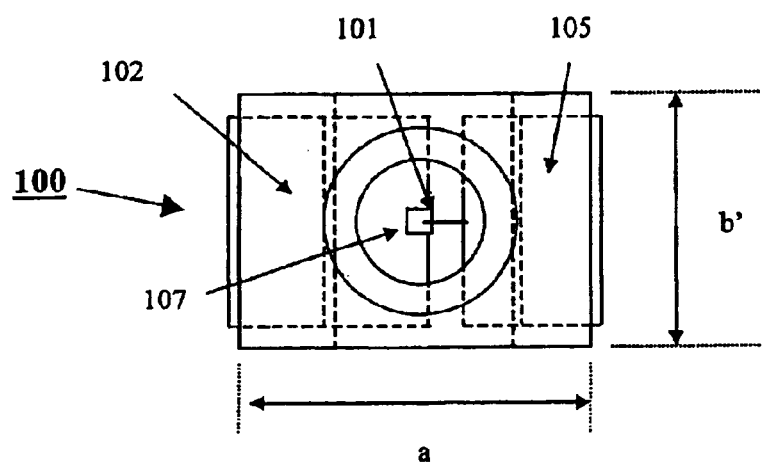

An embodiment of a surface mount opto-electronic device of the present invention is provided with two electrically conductive members along its underside (first surface). Front edges of the two electrically conductive members face each other across a gap and the rear edges (first portions) face away to form the terminals of the device, bending upwards at an angle to form a recess under the body of the device. A first electrode of an LED is mounted on the front end of a first one of the electrically conductive members. An electrically conductive inter-connect extends between the second electrode of the LED and the second electrically conductive member. Solder can be deposited at appropriate positions on a PCB and the device mounted on top such that the solder is positioned in the recess area and then reflowed. Alternatively, during a solder reflow process, solder enters into the recessed area, beneath the raised portions of the electrically conductive members. The solder connects the electrically conductive members to a substrate, with the solder extending little, if at all beyond the edges of the package.

Thus the invention provides a surface mountable electronic device that includes: a body with a first, mounting surface for mounting the device. The first surface is recessed with recessed portions in it. There is also a plurality of contacts (usually two or three) in the first surface. The electrical contacts include first portions, surfaces of which form at least part of the inner surface of each recessed portion.

Normally, the contacts extend along the first surface. If the first surface were mounted on a planar surface, the contacts would be in contact with that planar surface, whereas the first portions would be spaced apart from that planar surface.

The first portions may extend substantially parallel to or not parallel to the first surface, or may include portions of each. Preferably the first portions form at least part of the upper surface of the recessed portions, whether that is a horizontal or diagonal surface (which includes a curved diagonal surface). They may alternatively, or additionally form a vertical surface of the recessed portions. The first portions advantageously may be diagonally upward extending portions of the electrical contacts. Additionally, there may be horizontal portions of the electrical contacts, provided at the upper ends of the diagonally upward extending portions.

The electrical contacts further may include second portions, which, if the device were mounted on a planar surface, would be in contact with that planar surface. Such second portions could extend horizontally from the lower ends of the diagonally upward extending portions, if such were present.

The present devices are ideally constructed such that the space between a planar surface and the first portions, when the device is mounted on a planar surface, can be filled to adhere the device to the planar surface.

In preferred embodiments, the electrical contacts extend outwardly along the underside of the body, and the first portions are positioned towards the outside of the underside of said body. The first portions in the recessed portions would still be accessible from the sides of said device if the device were mounted on a planar surface. Normally, the electrical contacts might not extend beyond the edges of the body.

The present invention is most advantageously used where the device is an opto-electronic device. Such a device may then include at least one light emitting means provided within the body and electrically connected to the electrical contacts. Such light emitting means may be at least one light emitting diode mounted on a surface of one of the electrical contacts facing away from the mounting surface of the device and electrically connected to another of the electrical contacts.

The device of the invention may be mounted on a printed circuit board, with the electrical contacts in direct contact with terminals of the printed circuit board. Adhesive would fill the recesses between said first portions and the printed circuit board.

Preferably, the adhesive both electrically and adhesively connects the first portions to the terminals. The adhesive means is preferably solder, but may be a conductive epoxy adhesive.

Embodiments of the present invention are described herein in terms assuming the orientation shown in the drawings, with the contacts of the device being lowermost, that is in the underside. This is merely for descriptive purposes and is not limiting. The contacts may be uppermost or some other orientation in use.

Figure 4A:
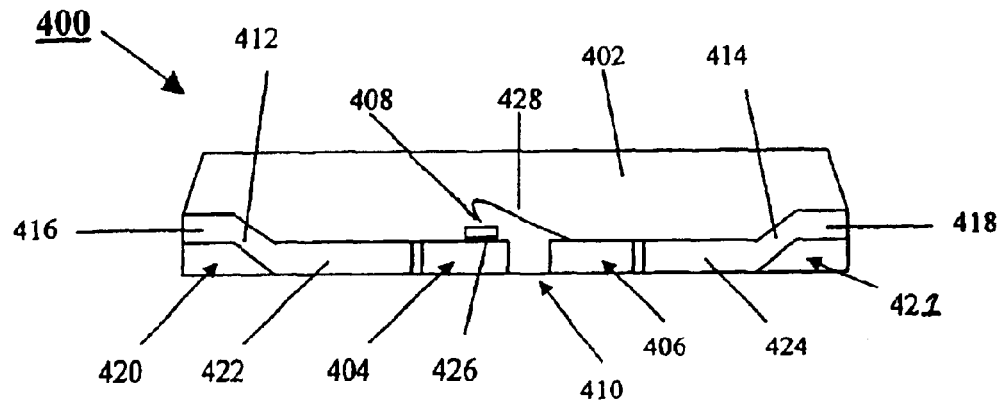
FIGS. 4A–4B are side and top views of a first embodiment of a lead-less surface mountable opto-electronic device according to the present invention.
Figure 4B:
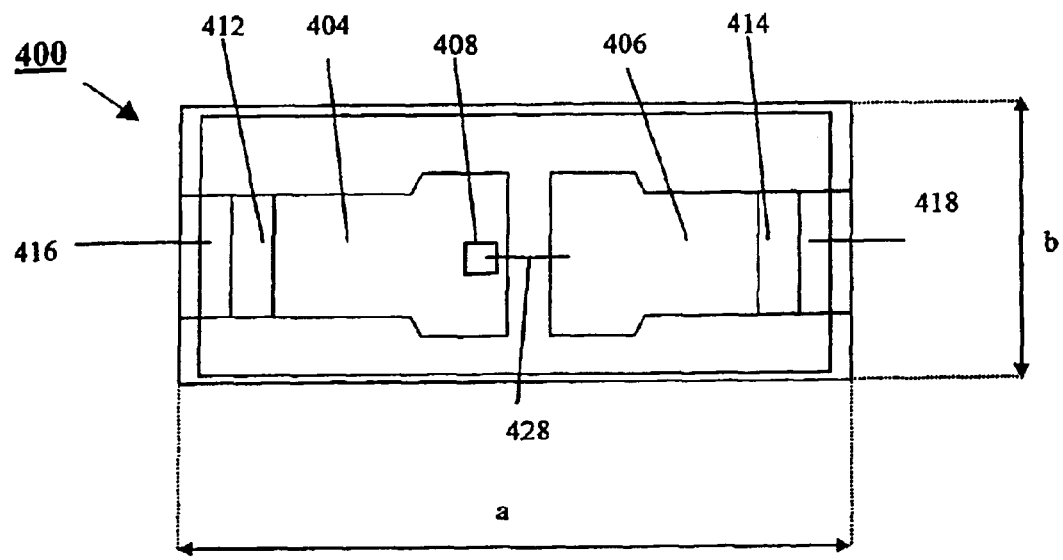

A surface mountable opto-electronic device 400 of a first embodiment is shown in FIGS. 4A–4B, with an optically transparent body 402, two generally flat electrical contacts, 404, 406 and an LED 408.

The body 402 is generally rectangular in plan view, although its side edges do slope outwards slightly, thus it is larger at its base than at its top. Its largest dimensions are length "a" by width "b".

The two electrical contacts 404, 406 are mounted in the underside 410 of the body 402, such that the undersides of the contacts 404, 406 are accessible from the outside. This underside 410 is itself the mounting surface of the device. The two contacts are separated by a gap in the middle of the device 400 and run horizontally from the middle to opposing ends of the device. A short distance from the respective end, each contact includes a first portion, which consists of a diagonally upward extending portion 412, 414, one at each end, followed by a horizontal portion 416, 418: effectively a zigzag. The body does not fill in below the first portions; there is nothing beneath them. The effect of this is to form recesses 420, 421, one at each end, between the first portions and a flat surface on which the device is mounted. The rest of each contact is its second portion 422, 424.

The LED 408 is mounted on the left hand one 404 of the two contacts through an electrically conductive medium 426, near the edge of the contact 404 that faces the other one 406 of the two contacts. A bond wire 428 electrically connects the top of the LED 408 to the near end of that other one 406 of the electrical contacts.

From above, the two contacts 404, 406 appear to be generally spatula or funnel shaped. The ends which face each other near the middle of the device are wider than the rest of each contact.

In this particular embodiment, the body 402 is an optically clear plastic that encapsulates the LED 408 and the top surfaces of the two contacts 404, 406.

Unlike the prior art devices mentioned earlier, the contacts do not extend horizontally beyond the body of the package. Instead the footprint is smaller, being the length "a" of the body and the width "b" of the body. Moreover, the recesses provide room for solder to mount the device to a PCB, with no need for the solder to extend beyond the length "a" of the body. Thus these devices can be more closely packed and there is no solder that is visible from above.

Figure 5A:
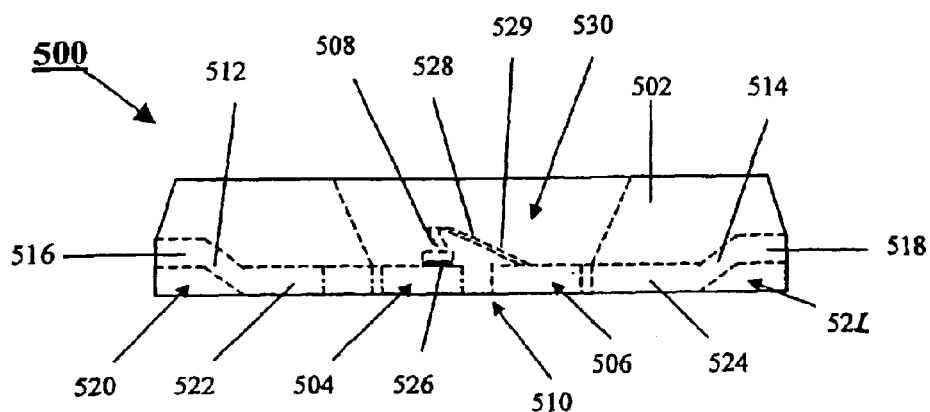
FIGS. 5A–5B are side and top views of a second embodiment of a lead-less surface mountable opto-electronic device according to the present invention.
Figure 5B:
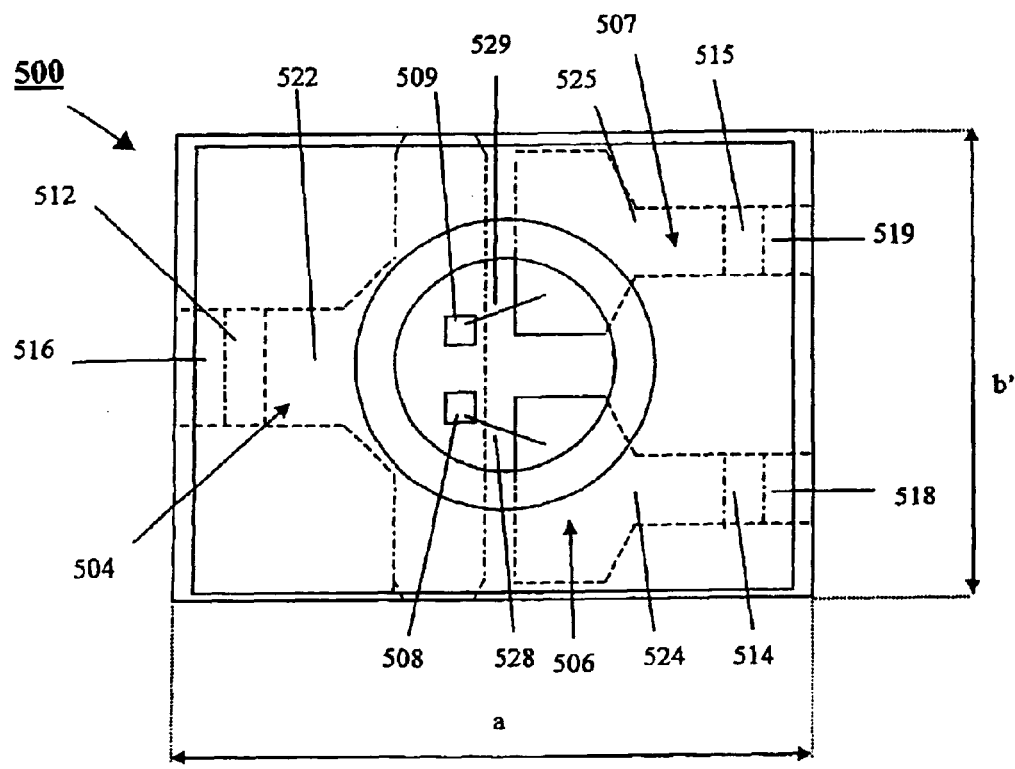

A second embodiment of the invention is shown in FIGS. 5A–5B.

A surface mountable opto-electronic device 500 includes a body 502, three generally flat electrical contacts, 504, 506, 507 and two LEDs 508, 509. In construction, the device 500 is quite similar to device 400 of the first embodiment.

The body 502 is generally rectangular in plan view, although it is wider than the first embodiment. Its side edges slope outwards slightly, thus it is larger at its base than at its top.

The three electrical contacts 504, 506, 507 are mounted in the underside, the mounting surface 510 of the body 502, such that the undersides of the contacts are accessible from below. The three contacts are all separated. The front end of the main contact 504 spans almost the entire device and faces both the other secondary contacts 506, 507 across a gap in the middle of the device 500. Those secondary contacts 506, 507 are parallel to each other. All three contacts 504, 506, 507 run horizontally from the middle to opposing ends of the device. A short distance from those ends, each contact includes a first portion, which consists of a diagonally upward extending portion 512, 514, 517, followed by a horizontal portion 516, 518, 519: effectively a zigzag. The body does not fill in below the first portions. The effect of this is to form recesses 520, one below the outer end of each contact, between the first portion of each contact and a flat surface on which the device is mounted. The rest of each contact is its second portion 522, 524, 525.

Both LEDs 508, 509 are mounted near the front end of the main contact 504 through an electrically conductive medium 526 and are separated from each other. Bond wires 528, 529 electrically connect the top of one LED 508 to the near end of one secondary contact 506 and the top of the other LED 509 to the near end of the other secondary contact 507.

From above, the main contact 504 is generally T shaped, with webs between the top of the T and the stem of the T. The two secondary contacts 506, 507 appear to be generally spatula or funnel shaped, as in the embodiment of FIGS. 4A–4B. The ends of the contacts, which face each other near the middle of the device are wider than the rest of each contact.

In this embodiment, the body 502 is an optically opaque plastic that encapsulates much of the top surfaces of the three electrical contacts 504, 506, 507, but not the two LEDs 508, 509 and an inverted frusto-conical cavity 530 therearound. This cavity 530 is filled with an optically clear plastic and, at the top is flush with the rest of the body. Thus the light in this embodiment is confined to escaping through the frusto-conical cavity.

Unlike the prior art devices mentioned earlier, the contacts do not extend horizontally beyond the body of the package. Instead the footprint is smaller, being the length "a" of the body and the width "b'" of the body. Moreover, the recesses provide room for solder to mount the device to a PCB, with no need for the solder to extend beyond the length "a" of the body. Thus these devices can be more closely packed and there is no solder that is visible from above.

Figure 6A:
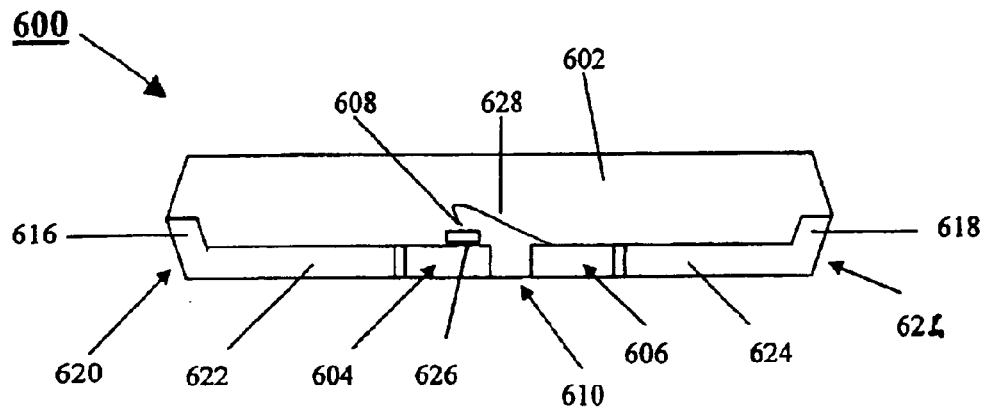
FIGS. 6A–6B are side and top views of a third embodiment of a lead-less surface mountable opto-electronic device according to the present invention.
Figure 6B:
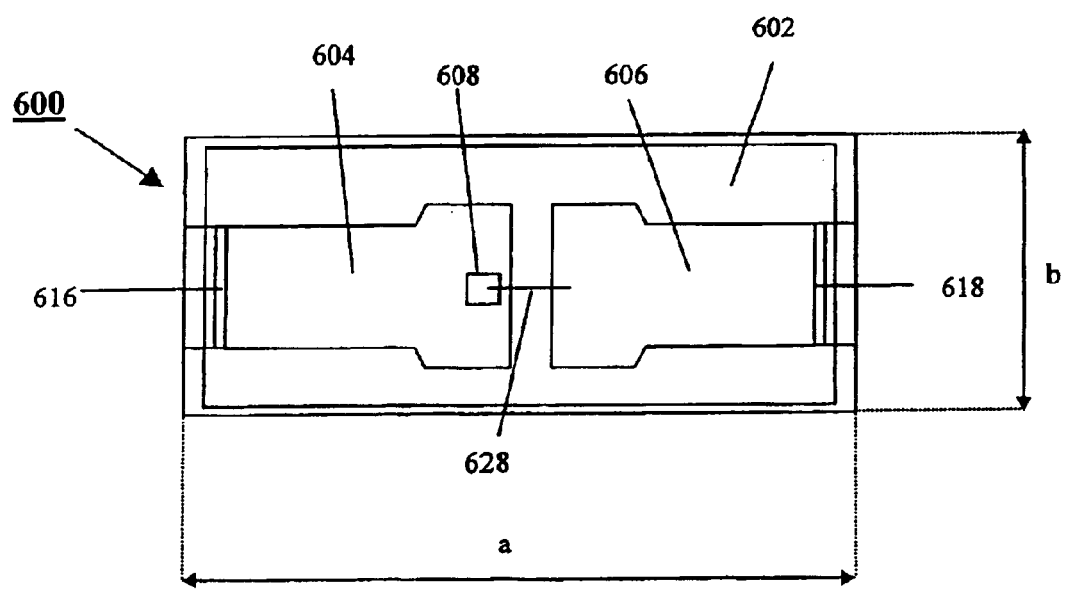

A third embodiment 600 is shown in FIGS. 6A–6B, which is similar to the embodiment of FIGS. 4A–4B, except for the shape of the electrical contacts, with corresponding features and components numbered accordingly, except for being prefaced with a 6, rather than a 4. An optically transparent body 602 has two horizontal contacts 604, 606. An LED 608 is mounted on a first contact 604. The two contacts are themselves provided in the underside 610 of the body 602. The contacts 604, 606 have outer ends ending in first portions 616, 618, which slope diagonally upwards, providing recesses, 620, 621 beneath them, one below each first portion 616, 618. The rest of each contact, not being the first portion is its second portion 622, 624. The LED 608 is mounted on the second portion 622 of the first contact, with a bond wire 628 connecting the top of the LED to the second portion 624 of the second contact 606.

The difference between this embodiment and that of FIGS. 4A–4B is in the first portions (and the associated areas of the body). In this embodiment, the first portions do not each consist of a diagonally upward extending portion followed by a horizontal portion. Instead, the first portions 616, 618, one at each end, just extend diagonally upwards near the ends of the contacts, although still beneath the body 602. The body does not fill in below the first portions 616, 618. Thus the first portions 616, 618 define recesses 620, 621 one at each end of the device 600. In this instance, the end shape of the body is the same as the shape defined by the outer surfaces of the first portions, that is it slopes diagonally upwards. However, an alternative embodiment of the invention would have the rest of the body extending substantially vertically down from the top outer edges of the first portions. In such an embodiment, the first portions would therefore be sunken within the ends of the body.

Unlike the prior art devices mentioned earlier, the contacts do not extend horizontally beyond the body of the package. Instead the footprint is smaller, being the length "a" of the body and the width "b" of the body. Moreover, the recesses provide room for solder to mount the device to a PCB, with no need for the solder to extend beyond the length "a" of the body. Thus these devices can be more closely packed and there is no solder that is visible from above.

Figure 7A:
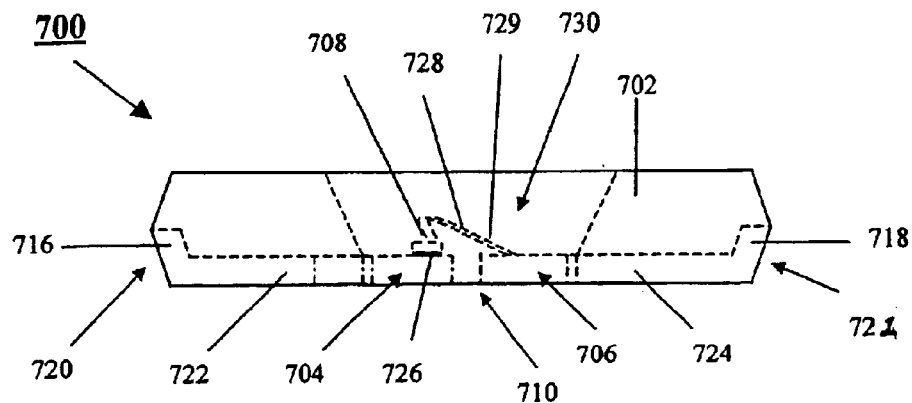
FIGS. 7A–7B are side and top views of a fourth embodiment of a lead-less surface mountable opto-electronic device according to the present invention.
Figure 7B:
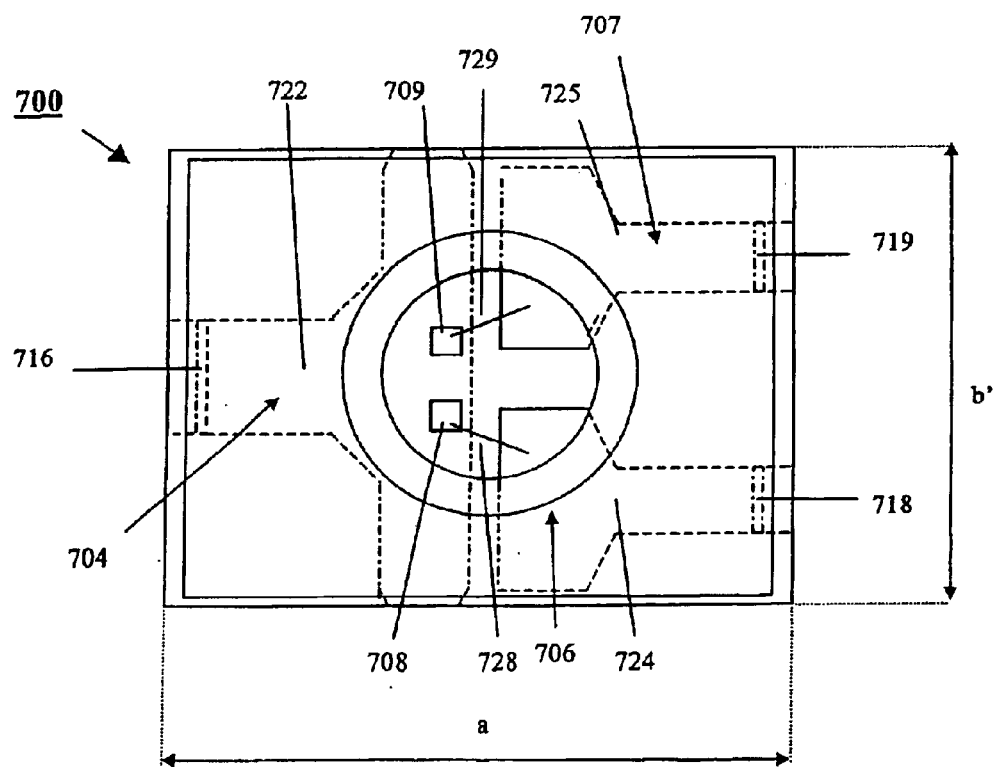

A fourth exemplary embodiment 700 is shown in FIGS. 7A–7B. This is similar to the embodiment of FIGS. 5A–5B, but shares the shape of the first portions of the contacts, as seen from the side, with the embodiment of FIG. 6, with corresponding features and components numbered accordingly, except for being prefaced with a 7, rather than a 5. A generally optically opaque body 702 has three horizontal contacts 704, 706, 707. Two LEDs 708, 709 are mounted on a first, main contact 704. The three contacts are themselves provided in the underside 710 of the body 702. The contacts 704, 706, 707 have outer ends ending in first portions 716, 718, 719, which slope diagonally upwards, providing recesses, 720, 721 beneath them, one below each first portion 716, 718, 719. The rest of each contact, not being the first portion is its second portion 722, 724, 725. The LEDs 708, 709 are mounted on the second portion 722 of the first contact 704, with a first bond wire 728 connecting the top of the first LED 708 to the second portion 724 of the first secondary contact 706, and a second bond wire 729 connecting the top of the second LED 709 to the second portion 725 of the second secondary contact 707. An inverted frusto-conical cavity 730, filled with an optically clear plastic allows light from the two LEDs 708, 709 to escape upwards.

The difference between this embodiment and that of FIGS. 5A–5B is in the first portions (and the associated areas of the body). In this embodiment, the three electrical contacts 704, 706, 707 include first portions 716, 718, 719, which just extend diagonally upwards at the ends of the contacts, although still beneath the body 702. The body does not fill in below the first portions 716, 718, 719. Thus the first portions 716, 718, 719 define recesses 720, 721 beneath them. As with the alternative embodiment for FIGS. 6A–6B, the body does not have to follow the shape of the first portions, but can have substantially vertical (or even various other) ends.

Unlike the prior art devices mentioned earlier, the contacts do not extend horizontally beyond the body of the package. Instead the footprint is smaller, being the length "a" of the body and the width "b'" of the body. Moreover, the recesses provide room for solder to mount the device to a PCB, with no need for the solder to extend beyond the length "a" of the body. Thus these devices can be more closely packed and there is no solder that is visible from above.

Figure 8A:
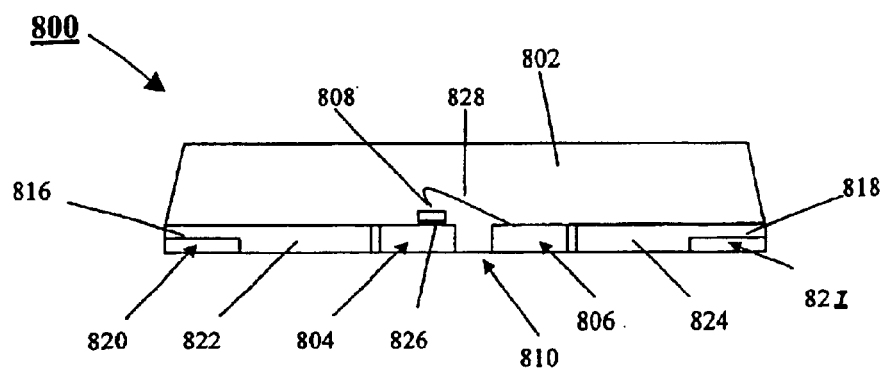
FIGS. 8A–8B are side and top views of a fifth embodiment of a lead-less surface mountable opto-electronic device according to the present invention.
Figure 8B:
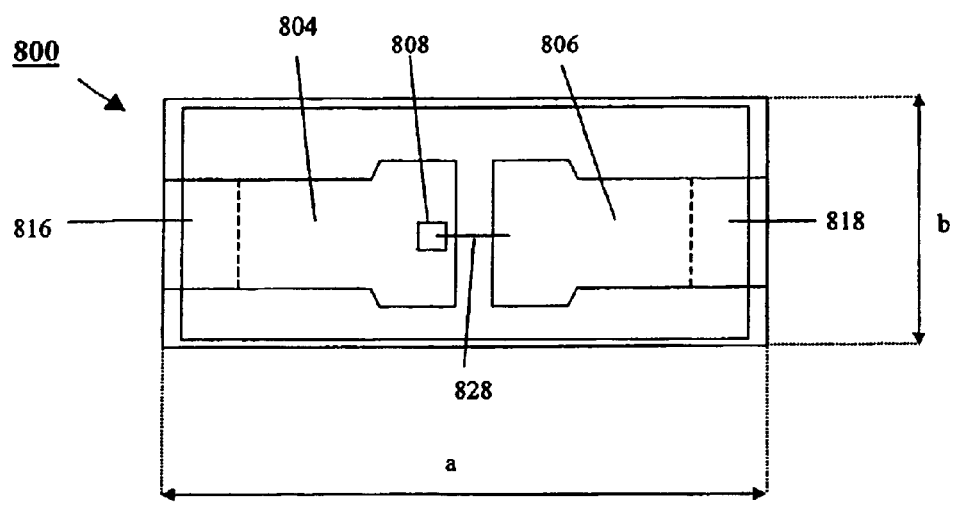

A fifth embodiment 800 is shown in FIGS. 8A–8B, which is similar to the embodiment of FIG. 4B, with corresponding features and components numbered accordingly, except for being prefaced with a 8, rather than a 4. An optically transparent body 802 has two horizontal contacts 804, 806. An LED 808 is mounted on a first contact 804. The two contacts are themselves provided in the underside 810 of the body 802. The contacts 804, 806 have outer ends ending in first portions 816, 818, the top surfaces of which are at the same level as the rest of each contact, but which are only half the vertical thickness of the rest of the contact. Thus there are recesses, 820, 821 beneath them, one below each first portion 816, 818. The rest of each contact, not being the first portion is its second portion 822, 824. The LED 808 is mounted on the second portion 822 of the first contact, with a bond wire 828 connecting the top of the LED to the second portion 824 of the second contact 806.

Thus the difference between the embodiments is in the shape and thickness of the first portions 816, 818 of the electrical contacts 804, 806 at the base of the body 802. In particular, rather than having a flat portion followed by a diagonally upward extending portion followed by a further flat portion, the tops of the contacts are flat, whilst the undersides of the contacts include a flat portion followed by a substantially orthogonal (vertical) portion, extending vertically upwards a short distance, before continuing again outwards with a further flat portion. The reduced thickness flat portions form the first portions 816, 818. The body does not fill in below the first portions 816, 818. Thus the first portions 810 define the recesses 820, 821.

Unlike the prior art devices mentioned earlier, the contacts do not extend horizontally beyond the body of the package. Instead the footprint is smaller, being the length "a" of the body and the width "b" of the body. Moreover, the recesses provide room for solder to mount the device to a PCB, with no need for the solder to extend beyond the length "a" of the body. Thus these devices can be more closely packed and there is no solder that is visible from above.

Figure 9A:
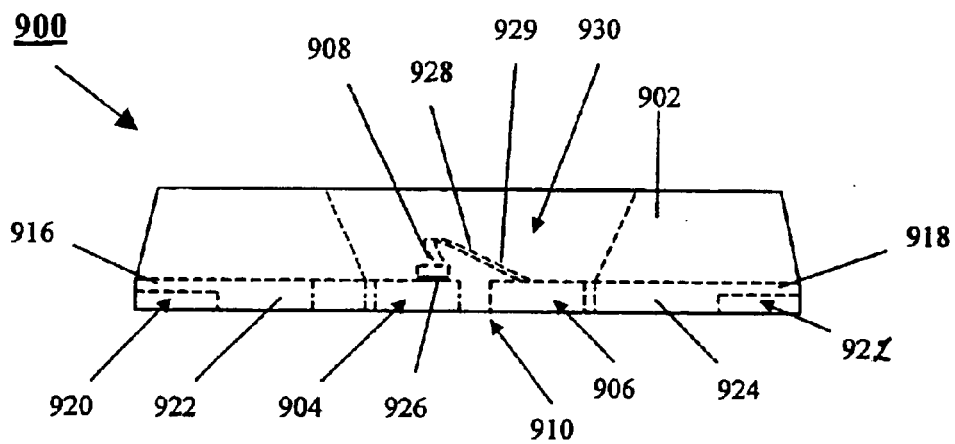
FIGS. 9A–9B are side and top views of a sixth embodiment of a lead-less surface mountable opto-electronic device according to the present invention.
Figure 9B:
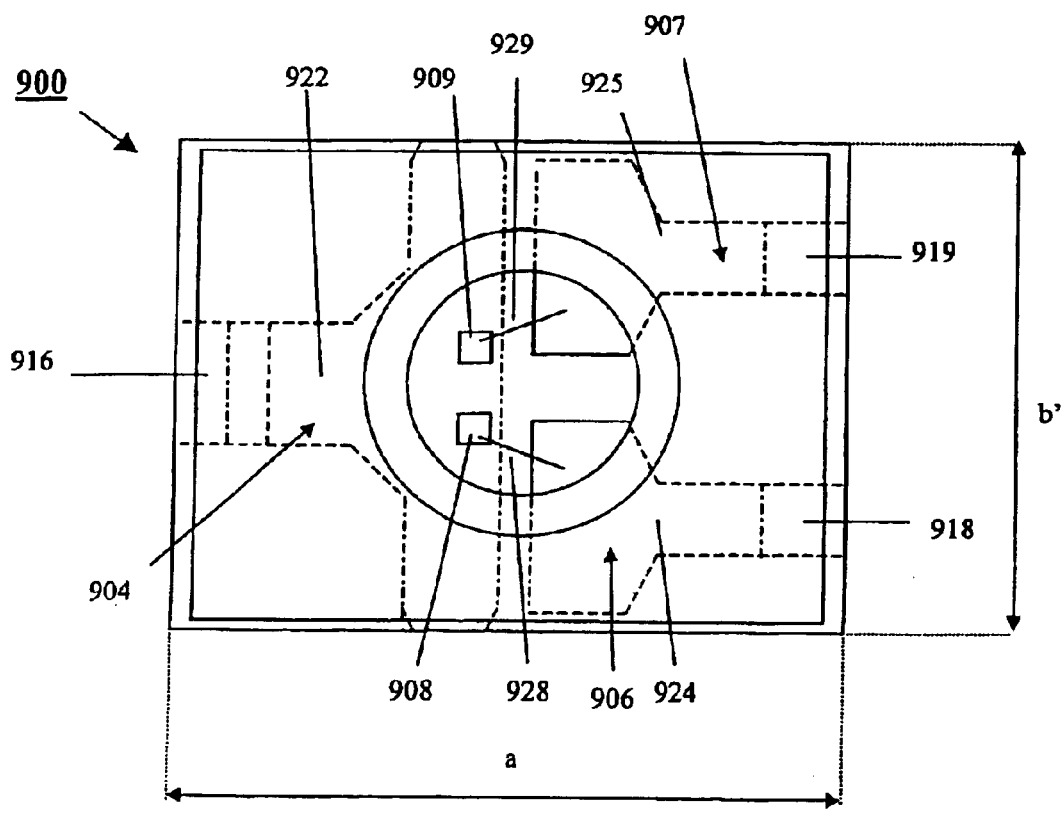

A sixth exemplary embodiment 900 is shown in FIGS. 9A–9B. This is similar to the embodiment of FIGS. 5A–5B, but shares the shape of the contacts, as seen from above, with the embodiment of FIG. 8, with corresponding features and components numbered accordingly, except for being prefaced with a 9, rather than a 5. A generally optically opaque body 902 has three horizontal contacts 904, 906, 907. Two LEDs 908, 909 are mounted on a first, main contact 904. The three contacts are themselves provided in the underside 910 of the body 902. The contacts 904, 906, 907 have outer ends ending in first portions 916, 918, 919, the top surfaces of which are at the same level as the rest of each contact, but which are only half the vertical thickness of the rest of the contact. Thus there are recesses, 920, 921 beneath them, one below each first portion 916, 918, 919. The rest of each contact, not being the first portion is its second portion 922, 924, 925. The LEDs 908, 909 are mounted on the second portion 922 of the first contact 904, with a first bond wire 928 connecting the top of the first LED 908 to the second portion 924 of the first secondary contact 906, and a second bond wire 929 connecting the top of the second LED 909 to the second portion 925 of the second secondary contact 907. An inverted frusto-conical cavity 930, filled with an optically clear plastic allows light from the two LEDs 908, 909 to escape upwards.

Thus the difference between the embodiments of FIGS. 5A–5B and 9A–9B is in the first portion 916, 918, 919 of each contact 904, 906, 907. These are orthogonally recessed, although still beneath the body 902. The body does not fill in below the first portions 916, 918, 919. Thus, as elsewhere, they define recesses 920, 921.

Unlike the prior art devices mentioned earlier, the contacts do not extend horizontally beyond the body of the package. Instead the footprint is smaller, being the length "a" of the body and the width "b'''" of the body. Moreover, the recesses provide room for solder to mount the device to a PCB, with no need for the solder to extend beyond the length "a" of the body. Thus these devices can be more closely packed and there is no solder that is visible from above.

Figure 10:
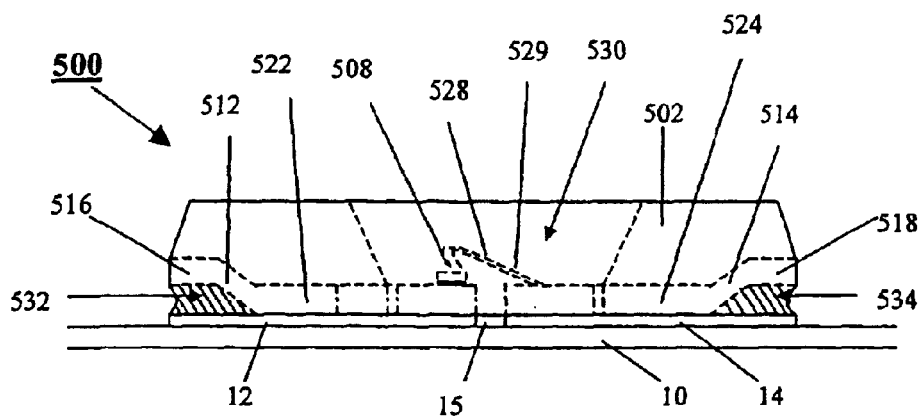
FIG. 10 is a side view of an assembly of a lead-less surface mountable opto-electronic device of the second embodiment mounted on a substrate.
Figure 11:
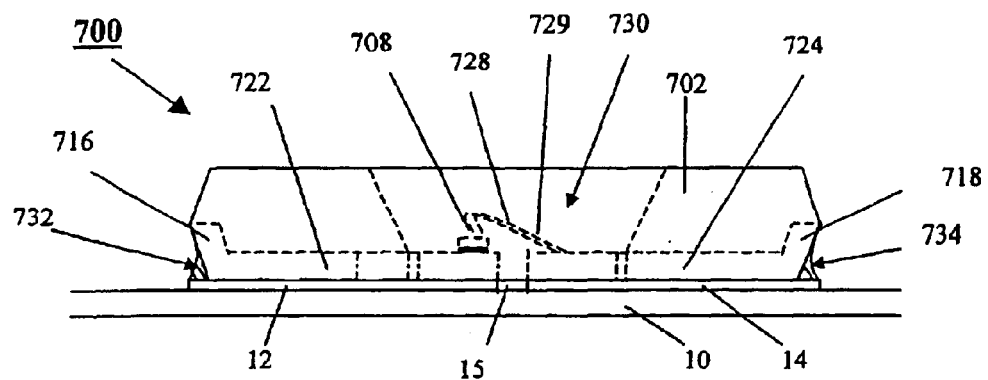
FIG. 11 is a side view of an assembly of a lead-less surface mountable opto-electronic device of the fourth embodiment mounted on a substrate.
Figure 12:
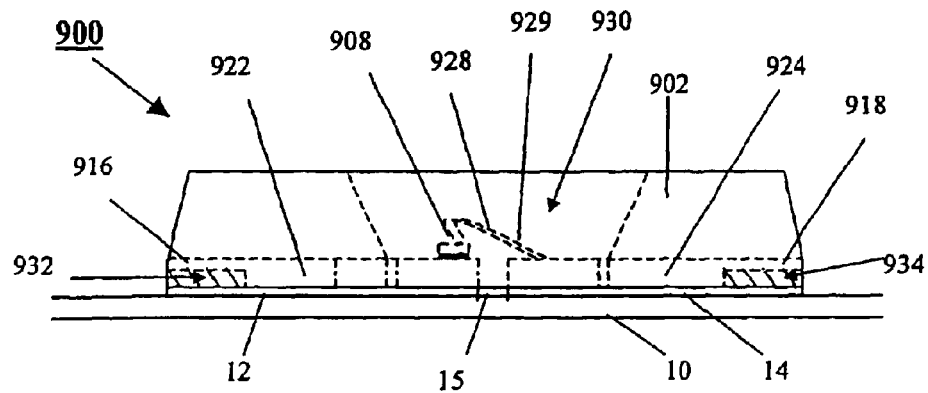
FIG. 12 is a side view of an assembly of a lead-less surface mountable opto-electronic device of the sixth embodiment mounted on a substrate.

FIG. 10 shows a side view of the embodiment of FIGS. 5A–5B in use. FIG. 11 shows a side view of the embodiment of FIGS. 7A–7B in use. FIG. 12 shows a side view of the embodiment of FIGS. 9A–9B in use. Although these are side views, the solder in each view is shown hatched; this is so that it can be more easily seen. Side views of the embodiments of FIGS. 4A–4B, 6A–6B and 8A–8B in use would be similar.

In FIG. 10, the device 500 is mounted on a printed circuit board (PCB) 10 through three electrically isolated solder pad terminals 12, 14 (of which of two can be seen in side view), each of which is separated from each other by a gap 15.

Main solder pad terminal 12 is in direct electrical contact with the main contact 504, for the entire horizontal length of the second portion 522 of the main contact 504. However, at the first portion 512, 516 of the main contact, the main contact is raised above solder pad terminal 12, and provides the recess 520 (shown in FIG. 5A). Separated secondary solder pad terminals 14 are in direct contact with the second portions 524, 525 of the secondary contacts 506, 507. However, at the first portions 514, 515, 518, 519 of the secondary contacts, the secondary contacts are raised above the secondary solder pad terminals 14, and provide the recesses 521 (shown in FIG. 5A). The three solder pad terminals 12, 14 not only act as electrical contacts with the mounted device 500, but they also act as heat sinks to dissipate heat.

Solder fillets 532, 534 fill the recesses 520, 521 and electrically and adhesively connect the device contacts 504, 506, 507 to the solder pad terminals 12, 14. In this way, the Surface Mounted Device is effectively mounted on the PCB 10. Additionally, as can be seen, the solder fillets 532, 534 do not extend horizontally beyond the package and thus do not increase the footprint of the device when mounted.

The same PCB 10 and solder pad terminals 12, 14 are shown in FIG. 11, but this time with device 700. As with the embodiment of FIG. 10, the solder fillets 732, 734 in recesses 720, 721 electrically and adhesively connect the device contacts 704, 706, 707 to the solder pad terminals 12, 14. The solder fillets 732, 734 extend only a little or not at all horizontally beyond the package and thus do not increase the footprint of the device when mounted.

The same PCB 10, solder pad terminals 12, 14 are also shown in FIG. 12, but this time with device 900. As with the embodiment of FIG. 10, the solder fillets 932, 934 in recesses 920, 922 electrically and adhesively connect the device contacts 904, 906, 907 to the solder pad terminals. The solder fillets 932, 934 extend only a little or not at all horizontally beyond the package and thus do not increase the footprint of the device when mounted.

Figure 13:
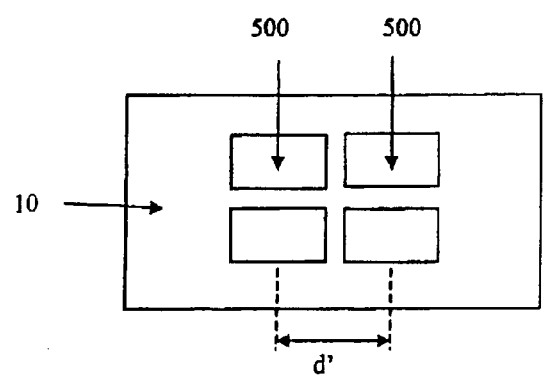
FIG. 13 is a plan view of an array of surface mountable opto-electronic devices of the second embodiment mounted on a substrate.

FIG. 13 shows an array of devices 500, each mounted as shown in FIG. 10, on a common PCB 10. Compared with the array of FIG. 3, the devices are more closely packed, leading to higher definition, with pitch "d'", being smaller than the pitch "d" of FIG. 3. Additionally, the solder fillets are invisible or near invisible, when the array is viewed from above, thereby improving contrast between the dark PCB surface and the light emitting array.

The contacts in the various embodiments run along the undersides of the opto-electronic devices. For ease of drawing, the bodies of the devices are shown extending down to either the top surfaces of the contacts or to the bottom of the surfaces of the contacts, However, the bodies could extend to any level between the top surfaces of the electrical contacts and the bottom surfaces of the contacts. Preferably, they would extend to about the same level as the bottom surfaces as the contacts, or possibly less far, for example half way down the thickness of each contact. Thus the contacts are, in effect, provided in recesses along the lengths of the bodies.

The present invention provides recesses with at least a horizontal component (even if only by way of a sloping portion). This allows a firmer and stronger solder connection within the same horizontal distance. If the point of contact of the solder with the device were merely a vertical surface, then a greater vertical extent would be needed to achieve a reasonable strength. On the other hand, the present invention provides a greater surface area for the solder to contact within the same horizontal and vertical space, to allow a strong bond.

The recesses are provided at the ends of the devices and are horizontally open to without, even once the device is in position, to allow solder to flow in or out.

In the described embodiments, only three particular shapes of contact have been shown, one with a diagonal component followed by a horizontal one, one merely with a straight diagonal component and the other with a vertical component followed by a horizontal one. Of course other shapes are possible including generally curved portions. Possibly, a further downward portion could be provided, although not so as to block off the recess from the outside. Within any one device, different designs of first portion are also possible.

The contacts are shown with parallel top and bottom surfaces. Whilst preferred, this is not essential. Moreover, they are shown as made up of generally planar portions. Again, this is not essential. They could undulate, or have patterned surfaces to improve adhesion, whether to the body or to a solder or the like.

The first portions are fabricated through the selective removal of contact material, such as in a selective etching process so that the necessary recess can be created. Alternatively, it could be through other processes, for instance stamping, machining, die casting or extrusion etc.

The recesses are formed by the shape of the mould used during the molding of the body.

In the embodiments described above, the recesses are of the same widths as the first portions of the contacts. Whilst preferred, this is not essential. The recesses could extend across more or less than those widths (for instance across the entire width of the device or across only a part of the first portions of the contacts). The amount would be determined by the moulds used in molding the bodies.

In the described embodiments, the bodies are optically clear when only one LED is present and opaque when two are present. The invention is not limited to this.

The contacts may take other shapes from those illustrated. For example, the widths could be the same at each end, may taper in the middle, etc. The shape can be variously designed to take into account factors like ease of heat flow, adhesion strength between the plastic and the contacts and also the ease of fabrication. Anchoring holes for example are typically employed to improve adhesion strength of the plastic body to the contacts. Generally, the final shape of the contacts will be determined through thermal and stress analysis simulations Additionally, the placement of the LEDs on the contacts can be interchanged and more than two LEDs can be used. Furthermore, the surfaces of the contacts where the LEDs are placed can be provided with cup-shaped cavities or depressions, within which the LEDs sit. The walls of the cavities act as reflectors and help to collect and direct side light emitted by the LEDs. Also, in the described embodiments, the bodies need not necessary be limited to a flat top. The top surface can be suitably shaped into a lens or a lens can be attached to the top surface in order to achieve the desired optical characteristic.

The described embodiments are applicable for SMDs with various package heights ranging from, for example, 0.25 mm to 10 mm and lengths and widths ranging from, for example, 0.25 mm to 50 mm. The recess heights typically range from 0.05 to 5 mm and the length of the first portions from about 0.1 mm to 5 mm. In the first and second embodiments the diagonal portions of the first portions are about 45 degrees.

For example, the embodiment of FIGS. 8A–8B may have a body length of about 1.6 mm, a width of about 0.8 mm and a height of about 0.4 mm, with the recess having a length of about 0.15 mm, a height of about 0.1 mm and a width of about 0.5 mm.

Numerous other embodiments are also possible within the scope of the invention as defined in the claims. Whilst the present invention has been described for use with LEDs, the concepts of the invention are also applicable to other SMDs, not least in the manner of reducing the pitch between adjacent SMDs.

What is claimed is:

1. A surface mountable electronic device, comprising:
   a packaged body having a mounting surface, the mounting surface having a plurality of recesses at side edges of the body and
   a plurality of electrical contacts, each of which extends from an interior portion of the mounting surface and terminates in one of said recesses, and each of which conforms to one of said recesses, wherein said recesses and electrical contacts are sized to provide offsets between said mounting surface and said electrical contacts.

2. The device of claim 1, wherein at least a portion of each electrical contact conforms to at least a portion of a recess that is substantially parallel to said mounting surface.

3. The device of claim 1, wherein at least a portion of each electrical contact conforms to at least a portion of a recess that is not parallel to said mounting surface.

4. The device of claim 3, wherein said portions of the recesses that are not parallel to said mounting surface are orthogonal to said mounting surface.

5. The device of claim 3, wherein said portions of the recesses that are not parallel to said mounting surface extend diagonally from said mounting surface.

6. The device of claim 1, wherein each recess comprises:
   a diagonal portion extending diagonally from said mounting surface; and
   a parallel portion extending substantially parallel to said mounting surface, between the diagonal portion and an edge of the device.

7. The device of claim 1, wherein said electrical contacts are heat sinks.

8. The device of claim 1, wherein the device is selected from a group comprising an opto-electric device and a light-emitting device.

9. The device of claim 1, wherein each recess comprises:
   an orthogonal portion extending orthogonally from said mounting surface; and
   a parallel portion extending substantially parallel to said mounting surface, between the orthogonal portion end an edge of the body.

10. The device of claim 1, wherein each recess extends diagonally from said mounting surface to an edge of said body.

11. The device of claim 1, wherein one or more of the recesses is bounded on three sides.

12. The device of claim 1, wherein one or more of the recesses extends the entire length of the side edge at which it is formed.

13. Apparatus, comprising:
   a printed circuit board having a plurality of pads thereon;
   a surface mountable electronic device, comprising:
      a packaged body having a mounting surface, the mounting surface having a plurality of recesses at side edges of the body; and
      a plurality of electrical contacts, each of which extends from an interior portion of the mounting surface and terminates in one of said recesses, and each of which conforms to one of said recesses, wherein said recesses and electrical contacts are sized to provide offsets between said mounting surface and said electrical contacts; and
   conductive adhesive, electrically and mechanically coupling each electrical contact of the surface mountable electronic device to a corresponding pod on the printed circuit board, the conductive adhesive being substantially confined to said recesses.

14. The apparatus of claim 13, wherein a plurality of said surface mountable electronic devices are mounted in an array on the printed circuit board.

* * * * *